US012593650B2

(12) United States Patent (10) Patent No.: US 12,593,650 B2

Inazumi (45) Date of Patent: Mar. 31, 2026

(54) TRANSPORT VEHICLE

(71) Applicant: Daifuku Co., Ltd., Osaka (JP)

(72) Inventor: Kyota Inazumi, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 162 days.

(21) Appl. No.: 18/758,362

(22) Filed: Jun. 28, 2024

(65) Prior Publication Data

US 2025/0006532 A1 Jan. 2, 2025

(30) Foreign Application Priority Data

Jun. 29, 2023 (JP) ................................. 2023-107401

(51) Int. Cl.
*H01L 21/00* (2006.01)
*B66C 13/06* (2006.01)
*H01L 21/677* (2006.01)
(52) U.S. Cl.
CPC ........ *H01L 21/67724* (2013.01); *B66C 13/06* (2013.01); *H01L 21/6773* (2013.01); *H01L 21/67733* (2013.01)

(58) Field of Classification Search
CPC ........... H01L 21/67724; H01L 21/6773; H01L 21/67733; B65G 49/07; B65G 1/0457; B65G 2201/0297; B66C 13/06
See application file for complete search history.

(56) References Cited

U.S. PATENT DOCUMENTS

2020/0331503 A1* 10/2020 Kobayashi ............ H01L 21/677

FOREIGN PATENT DOCUMENTS

JP 201788332 A 5/2017
WO WO-0113408 A1 * 2/2001 ......... H01L 21/6773

* cited by examiner

*Primary Examiner* — Emmanuel M Marcelo
(74) *Attorney, Agent, or Firm* — The Webb Law Firm

(57) ABSTRACT

A transport vehicle that transports a container while being suspended includes a lateral swing suppression device configured to abut against an outer side surface of the container that is suspended and held, and suppress a lateral swing of the container. The lateral swing suppression device includes an abutment roller configured to rotatably abut against the outer side surface of the container. A concave groove extending continuously over an entire periphery of an outer peripheral surface of the abutment roller is formed in a region corresponding to a convex portion of the container.

6 Claims, 8 Drawing Sheets

TRANSPORT VEHICLE

CROSS-REFERENCE TO RELATED APPLICATION

This application claims priority to Japanese Patent Application No. 2023-107401 filed Jun. 29, 2023, the disclosure of which is hereby incorporated by reference in its entirety.

BACKGROUND OF THE INVENTION

1. Field of the Invention

The present invention relates to a transport vehicle.

2. Description of Related Art

For example, in a semiconductor manufacturing plant or the like, a transport vehicle that transports a container that accommodates a wafer, a reticle, or the like is used. An example of such a transport vehicle is disclosed in Japanese Patent Application Laid-Open No. 2017-88332 (Patent Literature 1). The transport vehicle (ceiling transport vehicle 1) of Patent Literature 1 is configured to travel along rails installed on a ceiling, and is configured to transport a container (FOUP 50) while being suspended and held. In addition, the transport vehicle of Patent Literature 1 includes a lateral swing suppression device (swing suppression device 30) for suppressing lateral swing of the container suspended and held during transportation.

The lateral swing suppression device of Patent Literature 1 includes an arm mechanism (first arm 32 and second arm 34) and an abutment mechanism (biasing member 36, pressing mechanism 37, rotation portion 40, and restricting portions 42a and 42b) provided in the arm mechanism as illustrated in FIGS. 4 to 10 of Patent Literature 1. Further, the lateral swing suppression device is configured to switch between a state in which the abutment mechanism abuts against a lower side surface of the container and a state in which the abutment mechanism is separated from the lower side surface of the container in conjunction with a posture change of the arm mechanism. The abutment mechanism has a structure in which the rotation portion 40 rotates in conjunction with the shaking of the container in a width direction and the restricting portions 42a and 42b restrict the rotation portion 40 when the rotation portion 40 is about to rotate by a predetermined angle or more.

As described above, the lateral swing suppression device of Patent Literature 1 has a structure in which the rotation portion 40 abuts against the side surface of the container to suppress the swing of the container, but as described in paragraph 0036 of Patent Literature 1, the rotation portion 40 is made of a material such as urethane. Therefore, depending on a shape of the side surface of the container, wear may occur in the rotation portion 40, which may cause generation of dust or the like. However, in Patent Literature 1, such wear of the rotation portion 40 is not particularly considered.

SUMMARY OF THE INVENTION

Therefore, there is a demand for a transport vehicle that is able to suppress the lateral swing of the container suspended and held, and is able to suppress the wear due to the contact of the mechanism for suppressing the lateral swing with the container to a minimum.

A transport vehicle according to the present disclosure is a transport vehicle that transports a container while being suspended, the transport vehicle including a lateral swing suppression device configured to abut against an outer side surface of the container that is suspended and held, and suppress a lateral swing of the container, in which the lateral swing suppression device includes an abutment roller configured to rotatably abut against the outer side surface of the container, and a concave groove extending continuously over an entire periphery of an outer peripheral surface of the abutment roller is formed in a region corresponding to a convex portion that is a portion distinguished from the outer side surface of the container and protrudes outward compared to other portions adjacent to at least one of an upper side or a lower side of the container.

According to this configuration, by rotatably providing the abutment roller that abuts against the outer side surface of the container, the lateral swing of the container suspended and held during the transportation is able to be suppressed. In this case, in a case in which the outer side surface of the container has the convex portion, there is a concern that the outer peripheral surface of the abutment roller may be locally worn by coming into contact with the convex portion, but since the concave groove that extends continuously over the entire periphery is formed in the region corresponding to the convex portion, the abutment roller does not come into contact with the convex portion of the container. Therefore, the amount of generated dust or the like due to wear of the abutment roller is able to be suppressed to a minimum. From these, the lateral swing of the container suspended and held is able to be suppressed, the wear of the abutment roller due to the contact with the container is able to be suppressed to a minimum, and the amount of generated dust or the like is able to be suppressed to a minimum.

Further features and advantages of the technique according to the present disclosure will be more clearly understood from the following exemplary and non-limiting description of the embodiments with reference to the accompanying drawings.

DESCRIPTION OF THE INVENTION

Figure 1:
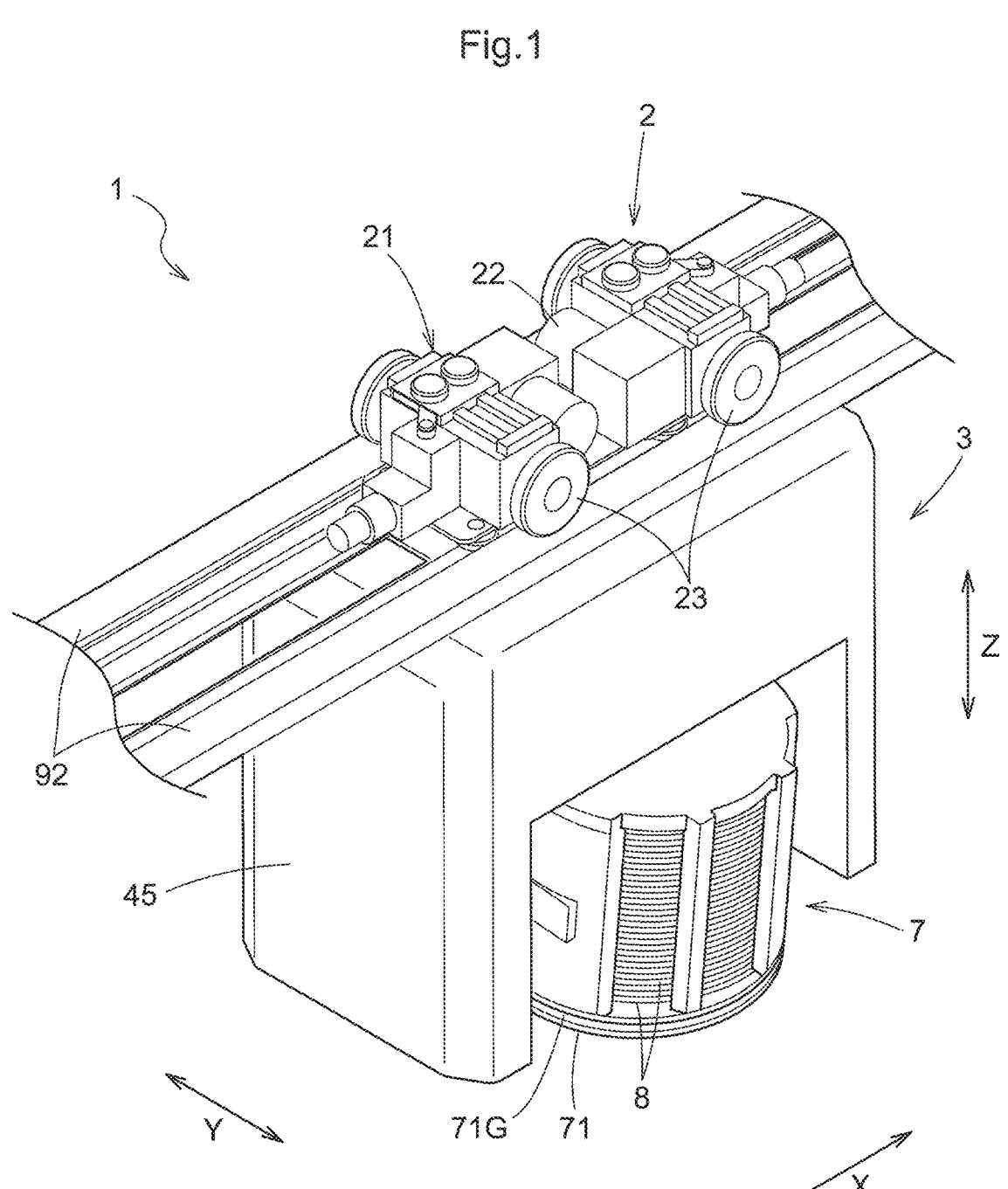
FIG. 1 is a perspective view of a transport vehicle according to an embodiment.
Figure 2:
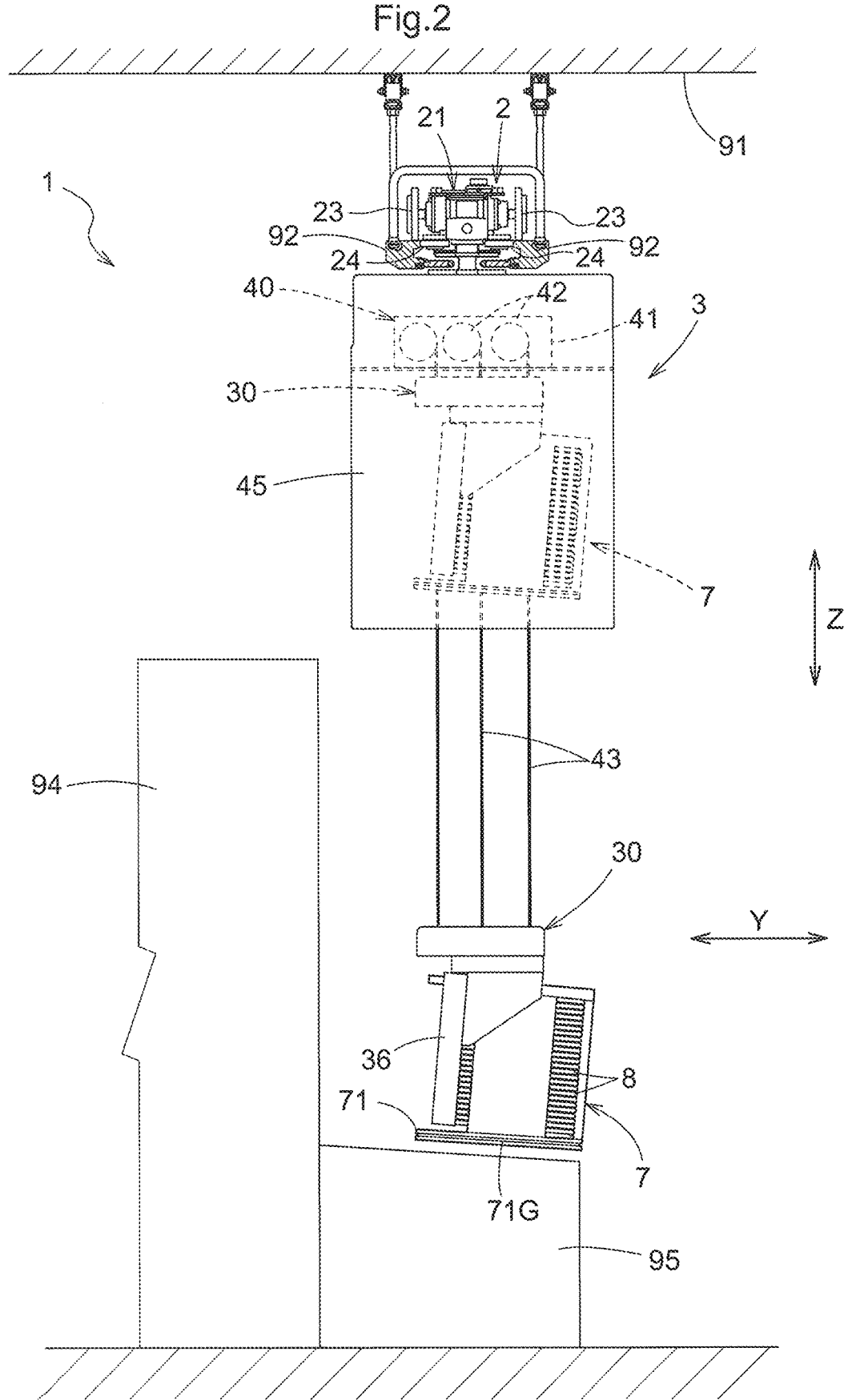
FIG. 2 is a front view of the transport vehicle.
Figure 3:
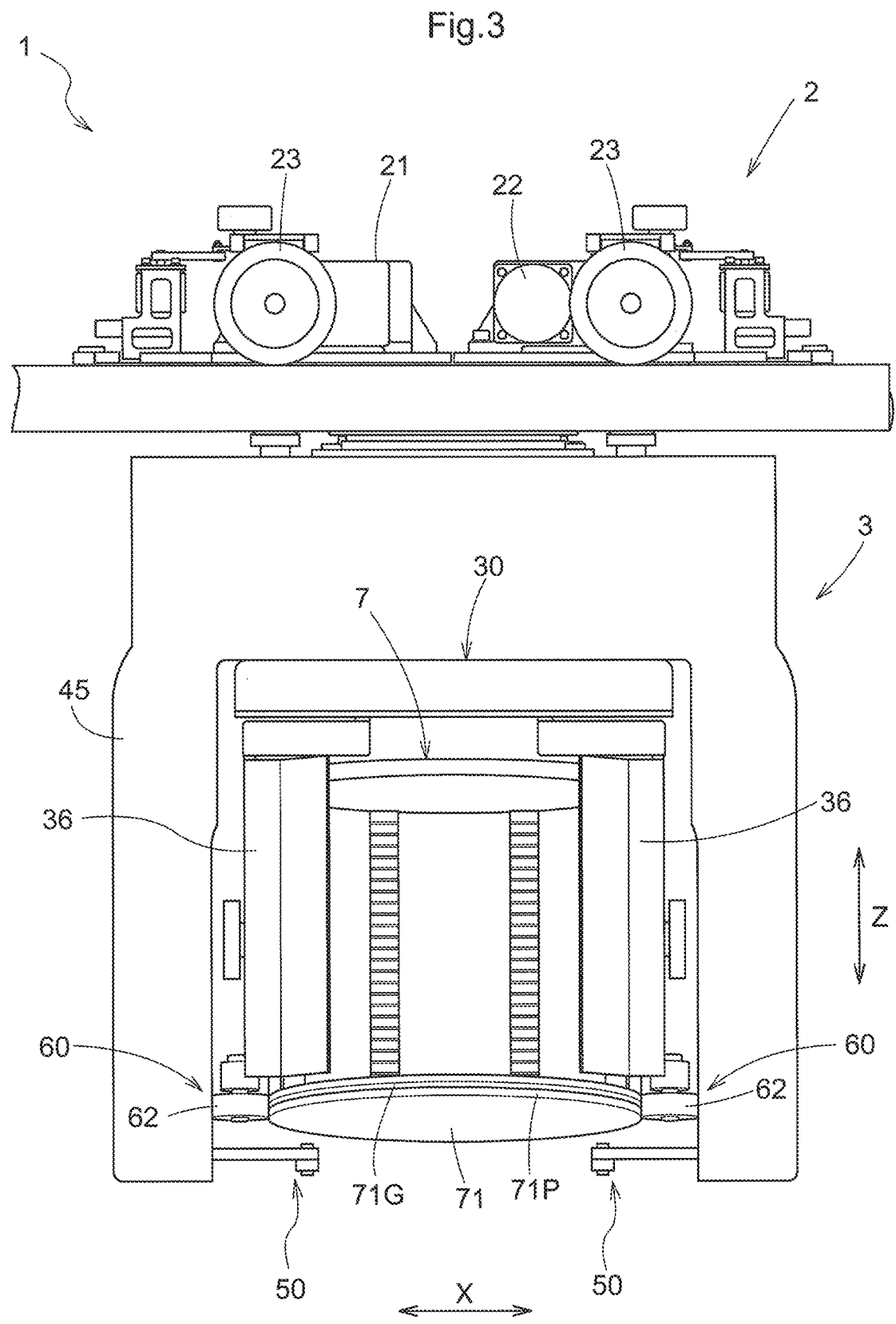
FIG. 3 is a side view of the transport vehicle.

An embodiment of a transport vehicle will be described with reference to the drawings. A transport vehicle 1 according to the present embodiment is used, for example, to transport a container 7 in a semiconductor manufacturing plant or the like. As illustrated in FIGS. 1 to 3, the transport vehicle 1 includes a travel unit 2 that travels along a movement path, and a transfer mechanism 3 connected to the travel unit 2. In the present embodiment, the movement path of the transport vehicle 1 is physically formed by rails 92 that are suspended and supported from a ceiling 91. That is, the transport vehicle 1 according to the present embodiment is a ceiling transport vehicle that moves along the rails 92 formed along the ceiling 91. The transport vehicle 1 transports the container 7 while being suspended.

The travel unit 2 travels along a pair of rails 92. The travel unit 2 includes a vehicle body 21, a travel drive unit 22, wheels 23, and guide wheels 24. The vehicle body 21 supports the travel drive unit 22, the wheels 23, the guide wheels 24, and the like. The travel drive unit 22 includes, for example, an electric motor such as a servo motor, and drives at least one of the wheels 23. The wheel 23 rolls on an upper surface of the rail 92. The wheel 23 that is drivingly connected to the travel drive unit 22 functions as a drive wheel. The guide wheel 24 rolls on an inner side surface of the rail 92. The travel unit 2 travels on the rails 92 along the rails 92 in a state in which the guide wheels 24 come into contact with and guided by the inner side surfaces of the rails 92.

In the following description, a direction along an extension direction of the rail 92, which is a direction in which the travel unit 2 travels, is referred to as a front-rear direction X of the transport vehicle 1. In addition, a direction orthogonal to the front-rear direction X and a direction along an arrangement direction of the pair of rails 92 is referred to as a width direction Y of the transport vehicle 1. In addition, a direction orthogonal to both the front-rear direction X and the width direction Y is referred to as an up-down direction Z. Each of these directions is a direction with the transport vehicle 1 as a reference, and the front-rear direction X and the width direction Y may vary depending on a position of the transport vehicle 1 along the movement path in a case of being viewed from a fixed point in a facility.

The transfer mechanism 3 is disposed below the rails 92 and is connected to the travel unit 2. The transfer mechanism 3 includes a holding device 30, a lifting and lowering device 40, and a cover body 45. In addition, the transfer mechanism 3 according to the present embodiment further includes falling restriction devices 50 and lateral swing suppression devices 60.

The holding device 30 is a device for holding the container 7. The lifting and lowering device 40 is a device for lifting and lowering the holding device 30. The lifting and lowering device 40 lifts and lowers the holding device 30 between a lifted position illustrated by a broken line and a lowered position illustrated by a solid line in FIG. 2. The cover body 45 accommodates the lifting and lowering device 40 and the holding device 30 in the lifted position. An inside space of the cover body 45 is shielded on both sides in the front-rear direction X, and at least one side (in the present example, both sides) in the width direction Y is open.

The falling restriction device 50 is a device for restricting the container 7 from falling in a state in which the holding device 30 in the lifted position holds the container 7. The lateral swing suppression device 60 is a device for suppressing the lateral swing of the container 7 in a state in which the holding device 30 in the lifted position holds the container 7. As illustrated in FIG. 3, the falling restriction device 50 and the lateral swing suppression device 60 are provided in the vicinity of a lower end portion of the cover body 45.

The transport vehicle 1, for example, the travel unit 2 travels to a position of a target processing device 94 in a state in which the holding device 30 holds the container 7, and as illustrated in FIG. 2, the lifting and lowering device 40 lowers the holding device 30 to the lowered position to transport the container 7 to the target processing device 94. FIG. 2 illustrates an example in which the container 7 is placed on a placing table 95 disposed adjacent to the processing device 94 to supply the container 7 to the target processing device 94. In addition, the transport vehicle 1 is able to transport the container 7 out of the processing device 94 in which processing is terminated by performing an operation opposite to the above description.

Figure 4:
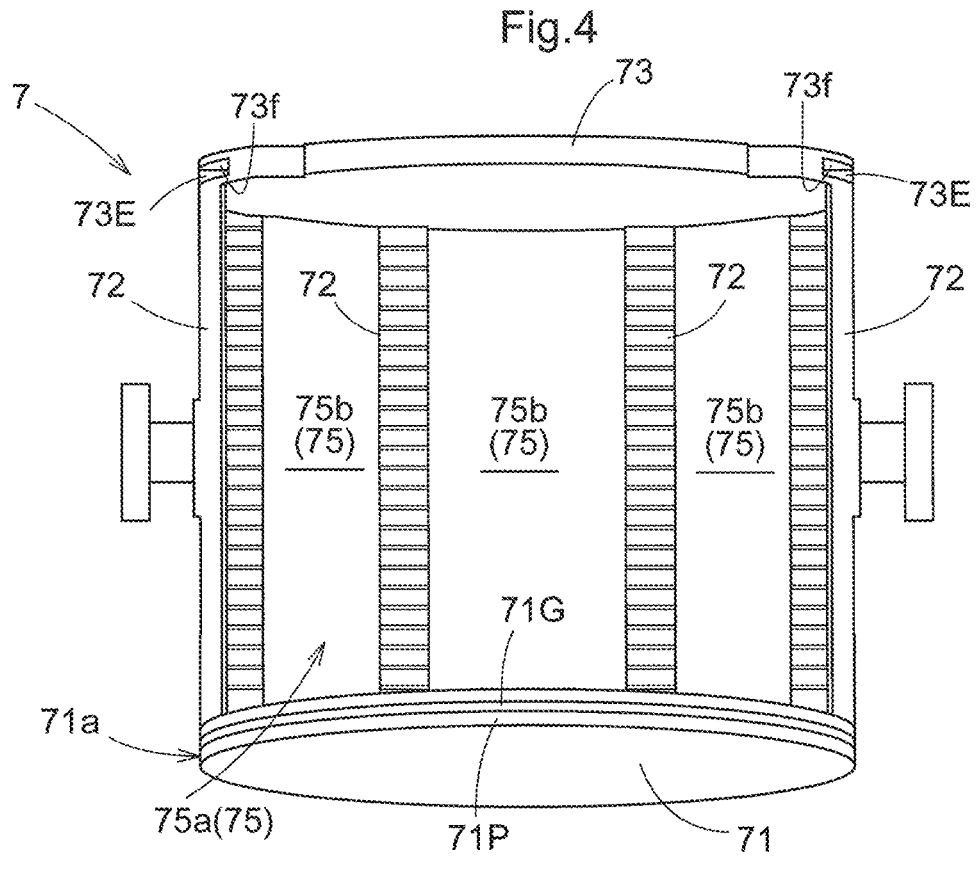
FIG. 4 is a front view of a container.
Figure 5:
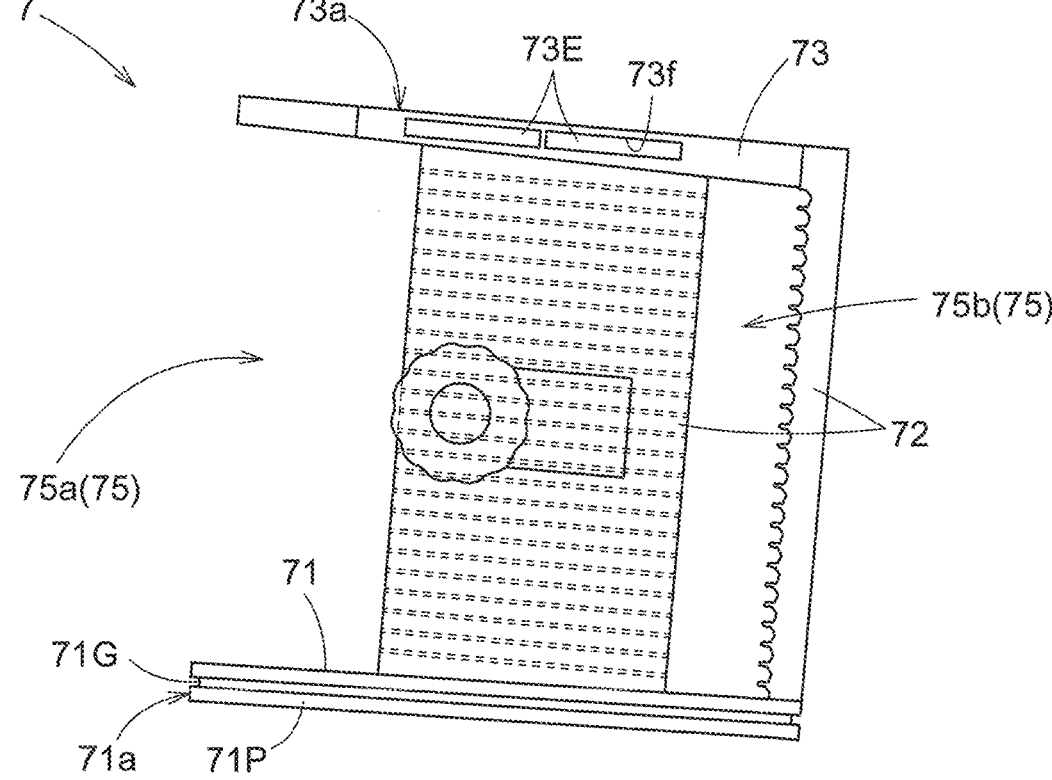
FIG. 5 is a side view of the container.

As illustrated in FIGS. 4 and 5, the container 7, which is a transport object by the transport vehicle 1 according to the present embodiment, includes a bottom plate 71, a side wall 72, and an inclined top plate 73. These are integrally formed. The bottom plate 71 is a support plate provided at a lower end portion of the container 7, and is formed in a circular shape in the present embodiment. The side wall 72 extends upward from an outer edge of the bottom plate 71 and is formed in a cylindrical shape having an opening 75 in the present embodiment. The inclined top plate 73 is provided at an upper end portion of the side wall 72 and is formed in a circular shape similar to the bottom plate 71 in the present embodiment. In the present embodiment, the inclined top plate 73 is provided to be non-parallel to the bottom plate 71, in other words, inclined with respect to the bottom plate 71. A degree of inclination of the inclined top plate 73 with respect to the bottom plate 71 may be very small, and an inclination angle may be, for example, $1°$ to $10°$.

In the present embodiment, a peripheral groove 71G is formed in the bottom plate 71. The peripheral groove 71G is formed to be recessed from an outer side surface 71a of the bottom plate 71 toward the inside. In addition, the peripheral groove 71G according to the present embodiment is continuously formed over an entire periphery in a state of having a certain width and a certain depth. A portion of the bottom plate 71 on the lower side with respect to the peripheral groove 71G is a portion that protrudes outward in a radial direction with respect to a bottom surface (surface facing the radial direction) of the peripheral groove 71G. In the following description, the portion is referred to as a convex portion 71P, which is distinguished from an outer side surface 71a of the bottom plate 71 at a portion on an upper side with respect to the peripheral groove 71G or an outer side surface 72a of the side wall 72. In the present embodiment, the convex portion 71P is continuously formed over the entire periphery in accordance with a forming shape of the peripheral groove 71G. In addition, the outer side surface of the convex portion 71P is located on the same cylindrical surface as the outer side surface 71a of the bottom plate 71 or the outer side surface 72a of the side wall 72.

In addition, in the present embodiment, a concave portion 73E that is recessed inward with respect to the side wall 72 is formed on an outer edge side of the inclined top plate 73. The concave portion 73E is formed at two locations which are different in the circumferential direction of the inclined top plate 73 (specifically, at two locations that are opposite to each other with a center of the container 7 interposed therebetween). The container 7 is supported from below by support portions 32 provided in the holding device 30 of the transport vehicle 1 at the concave portions 73E on the outer edge side of the inclined top plate 73. More specifically, the container 7 is supported from below by a pair of support portions 32 provided in the holding device 30 of the transport vehicle 1, with a pair of concave portions 73E formed on the outer edge side of the inclined top plate 73.

As described above, the container 7 according to the present embodiment has the opening 75 in the side wall 72. In the present embodiment, the opening 75 includes a front opening 75*a* formed on the front side and a rear opening 75*b* formed on the rear side. The front opening 75*a* is formed with a large width of the opening, and is formed with a width wider than at least a maximum width of an accommodated object 8. The rear opening 75*b* is formed with a smaller width than the front opening 75*a*, and is formed with a width narrower than the maximum width of the accommodated object 8. In the present embodiment, three rear opening portions 75*b* are formed side by side to be spaced apart from each other at predetermined intervals.

The accommodated object 8 accommodated in the container 7 is taken in and out from the front opening 75*a*. That is, among the openings 75 formed in the side wall 72, the front opening 75*a* serves as an opening for taking in and out the accommodated object 8. Examples of the accommodated object 8 include a semiconductor wafer, a reticle, and the like. The container 7 is configured to be capable of accommodating a plurality of accommodated objects 8 side by side vertically. In addition, the container 7 according to the present embodiment does not include a lid for closing the opening 75, and an open cassette is able to be used, for example.

Figures 6, 7:
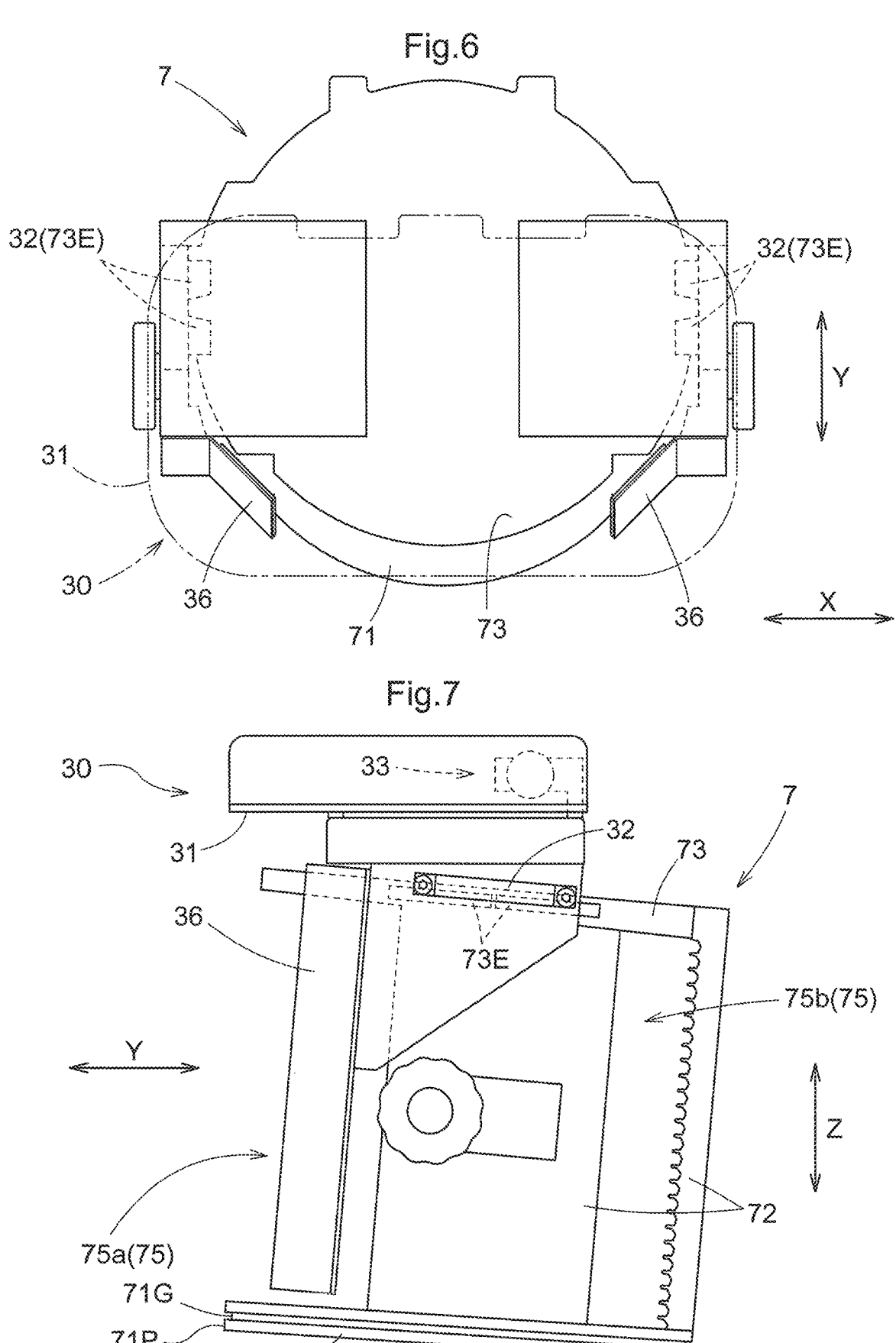
FIG. 6 is a plan view of a holding device.
FIG. 7 is a front view of the holding device.
Figure 8:
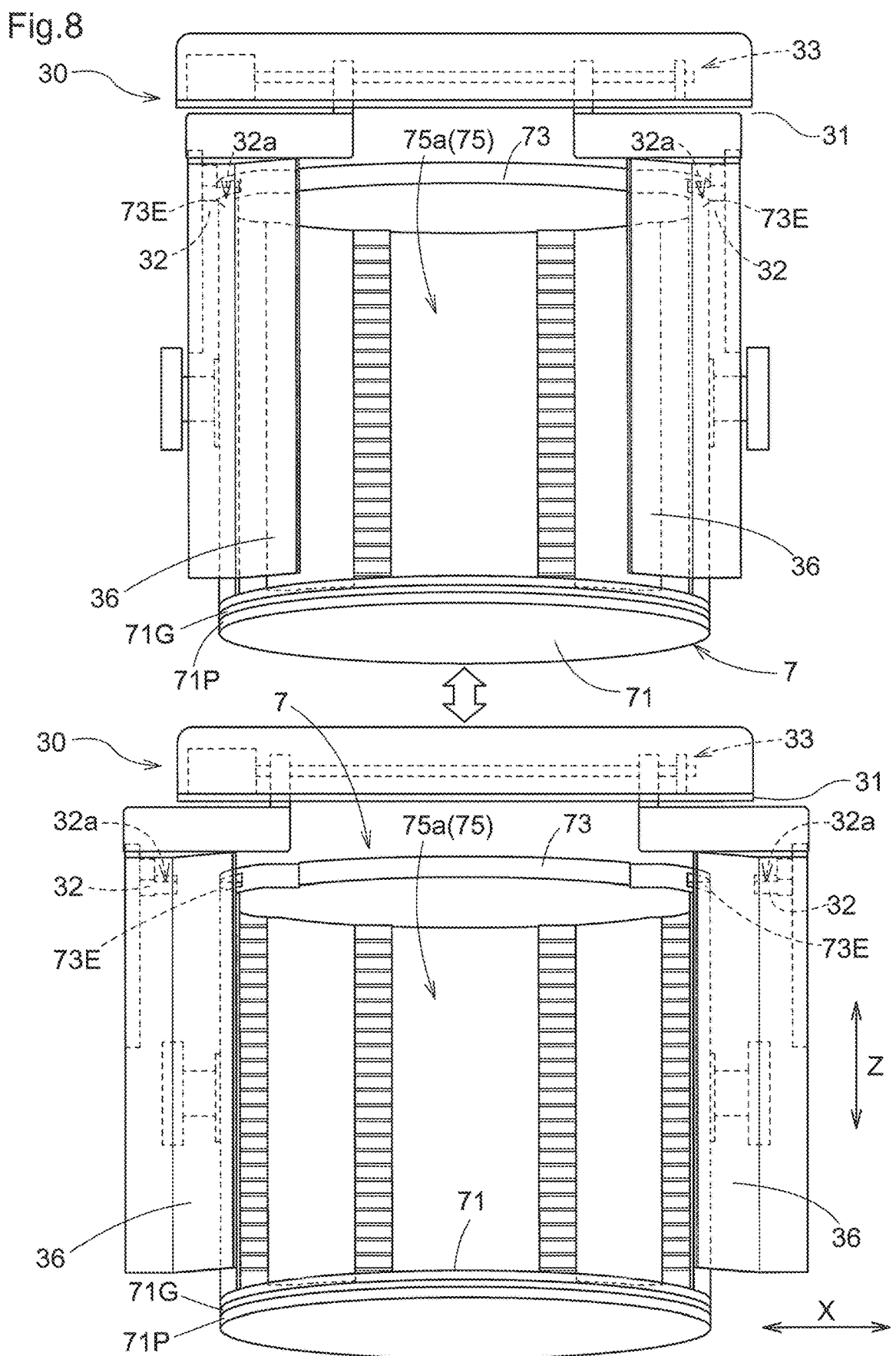
FIG. 8 is a side view illustrating a posture change of a support portion and a shielding member.

Returning to the description of the transport vehicle 1, the holding device 30 constituting the transfer mechanism 3 includes a holding main body portion 31, the support portions 32, a holding drive unit 33, and a shielding member 36, as illustrated in FIGS. 6 to 8.

The holding main body portion 31 is a portion serving as a base of the holding device 30. The holding main body portion 31 supports the support portion 32 and the shielding member 36 to be slidable in the front-rear direction X. In addition, the holding main body portion 31 fixedly supports the holding drive unit 33 on the upper surface side thereof.

The support portion 32 supports the concave portion 73E of the inclined top plate 73 of the container 7. In the present embodiment, the pair of support portions 32 are provided to be able to simultaneously support the pair of concave portions 73E at different positions in the circumferential direction of the inclined top plate 73. The pair of support portions 32 are provided side by side in the front-rear direction X with predetermined intervals therebetween. The pair of support portions 32 are each configured to be slidable in the front-rear direction X, and are driven by the holding drive unit 33 to move close to each other in the front-rear direction X or to move separated from each other in the front-rear direction X.

The holding drive unit 33 moves the pair of support portions 32 in the front-rear direction X. The holding drive unit 33 is configured to include, for example, a holding electric motor and a mechanism (for example, a ball screw mechanism) that converts the rotation of the holding electric motor into the propulsion force in the front-rear direction X. The holding drive unit 33 moves the pair of support portions 32 in opposite directions to each other to move the support portions 32 to be close to each other in the front-rear direction X or to move the support portions 32 to be separated from each other in the front-rear direction X. In a case in which the holding drive unit 33 includes the ball screw mechanism, helical directions of a screw shaft is formed to be opposite to each other on one side and the other side in the front-rear direction X, so that the above-described proximity movement and separation movement are able to be performed only by the single holding electric motor.

The holding drive unit 33 is able to be in a holding posture in which the container 7 is held by supporting the concave portion 73E of the inclined top plate 73 by moving the pair of support portions 32 close to each other in the front-rear direction X. In addition, the holding drive unit 33 is able to be in a holding release posture in which the holding of the container 7 is released by separating from the concave portion 73E of the inclined top plate 73 by moving the pair of support portions 32 separated from each other in the front-rear direction X. As described above, the holding drive unit 33 is able to change the posture of the pair of support portions 32 between the holding posture and the holding release posture.

The shielding member 36 partially covers the front opening 75*a* of the container 7 in a state in which the holding device 30 holds the container 7. In the present embodiment, a pair of shielding members 36 are provided to partially cover regions on both sides of the front opening 75*a* of the container 7 in the front-rear direction X. The pair of shielding members 36 are configured to change the posture between a closed posture and an opened posture. Here, the closed posture is a posture in which the pair of shielding members 36 face the front opening 75*a* at least partially in a state in which the pair of support portions 32 support the concave portion 73E of the inclined top plate 73. The opened posture is a posture in which the pair of shielding members 36 do not face the front opening 75*a* in a state in which the pair of support portions 32 support the concave portion 73E of the inclined top plate 73.

In the present embodiment, the shielding member 36 is integrally connected to a support bracket to which the support portion 32 is fixed. One of the pair of shielding members 36 is connected to one of the pair of support portions 32 via a first support bracket, and these are interlocked to each other to be movable in the front-rear direction X. In addition, the other of the pair of shielding members 36 is connected to the other of the pair of support portions 32 via a second support bracket, and these are interlocked to each other to be movable in the front-rear direction X. The pair of shielding members 36 are configured to be in the closed posture as the pair of support portions 32 are in the holding posture and to be in the opened posture as the pair of support portions 32 are in the holding release posture by being interlocked to the posture change of the pair of support portions 32. The pair of shielding members 36 prevent the accommodated object 8 from slipping out of the container 7 in the closed posture.

The lifting and lowering device 40 lifts and lowers the holding device 30. As illustrated in FIG. 2, the lifting and lowering device 40 includes a lifting and lowering main body portion 41, lifting and lowering drive units 42, and wires 43. The lifting and lowering main body portion 41 is a portion serving as a base of the lifting and lowering device 40. The lifting and lowering main body portion 41 fixedly supports the lifting and lowering drive unit 42 on an upper surface side thereof. The lifting and lowering drive unit 42 is configured to include, for example, a lifting and lowering electric motor and a winding portion that rotates integrally with the lifting and lowering electric motor. One end of the wire 43 is connected to the winding portion constituting the lifting and lowering drive unit 42, and the other end thereof is connected to the holding device 30. The lifting and lowering device 40 lifts and lowers the holding device 30 between the lifted position and the lowered position by driving the lifting and lowering drive unit 42 to wind or unwind the wire.

Figure 9:
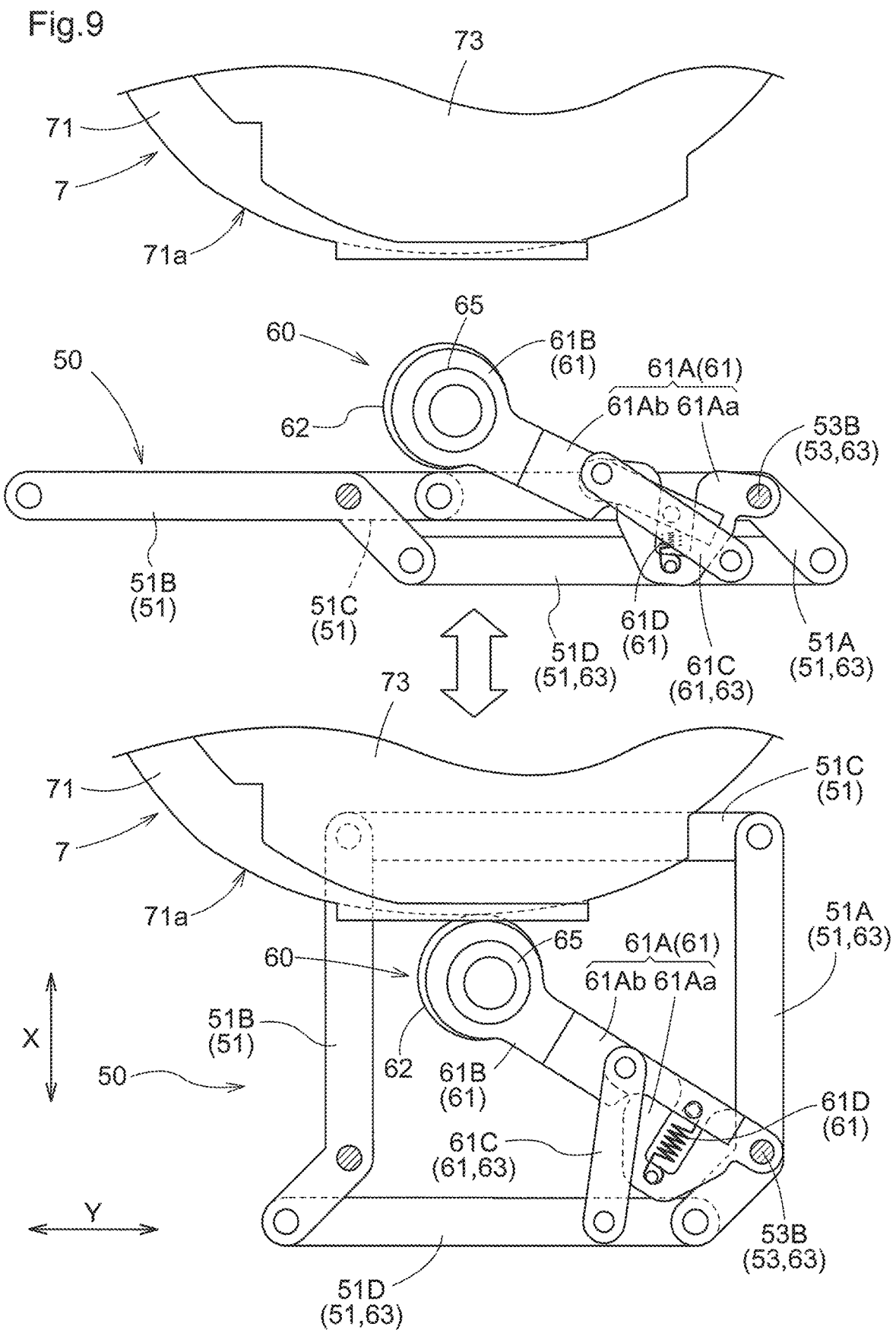
FIG. 9 is a plan view illustrating a posture change of a falling restriction device and a lateral swing suppression device.
Figure 10:
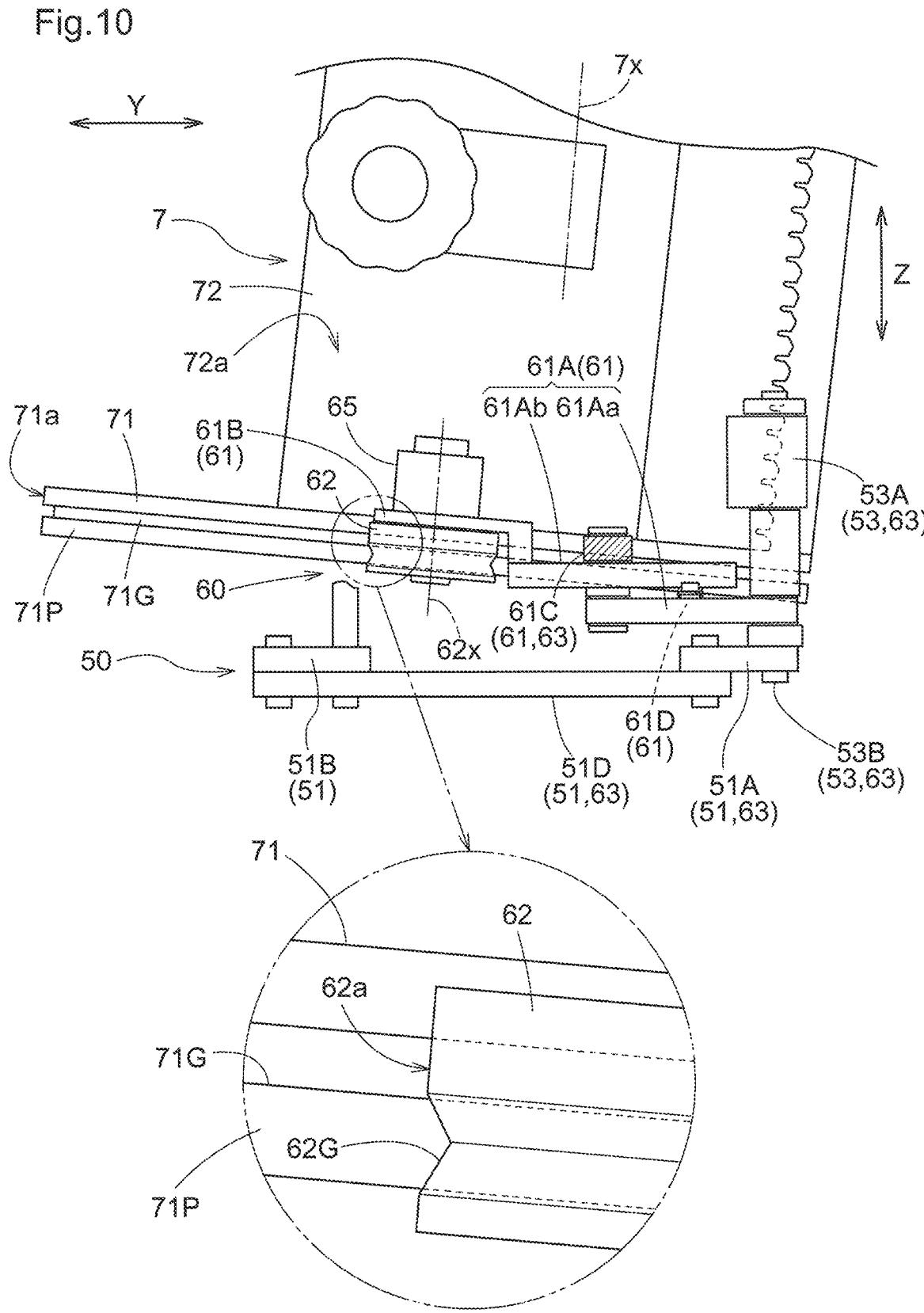
FIG. 10 is a view of the falling restriction device and the lateral swing suppression device as viewed from a side.

The falling restriction device 50 restricts the falling of the container 7 in a state in which the holding device 30 in the lifted position holds the container 7. As illustrated in FIGS. 9 and 10, the falling restriction device 50 includes a falling restriction member 51 and an in-and-out drive unit 53.

The falling restriction member 51 is a member for restricting the falling of the container 7, which is disposed on a lower side with respect to the bottom surface (lower surface of the bottom plate 71) of the container 7. As illustrated in a lower portion of FIG. 9, a part of the falling restriction member 51 is disposed to be able to overlap with the container 7 when viewed in the up-down direction in a state in which the holding device 30 in the lifted position holds the container 7.

The falling restriction member 51 according to the present embodiment includes a driven arm 51A, a parallel arm 51B, a first connecting arm 51C, and a second connecting arm 51D. The driven arm 51A is formed to be obtuse angle-curved to have a long-side portion and a short-side portion when viewed in the up-down direction. The driven arm 51A is connected to a drive shaft 53B constituting the in-and-out drive unit 53 at a position of a bent portion of a boundary between the long-side portion and the short-side portion. The driven arm 51A is driven by the in-and-out drive unit 53 and is rotatable within a predetermined angle range. The parallel arm 51B is formed in the same shape as the driven arm 51A and is disposed in parallel with the driven arm 51A at a position different from the driven arm 51A in the width direction Y. The parallel arm 51B is rotatably supported by the cover body 45 at a position of a bent portion of a boundary between a long-side portion and a short-side portion.

The first connecting arm 51C is formed in a linear shape when viewed in the up-down direction. The first connecting arm 51C connects, in a freely variable angle, one end of each of the driven arm 51A and the parallel arm 51B (in the present example, a distal end portion of the long-side portion) to each other. The second connecting arm 51D is formed with the same shape as the first connecting arm 51C, and connects, in a freely variable angle, the other end of each of the driven arm 51A and the parallel arm 51B (in the present example, a distal end portion of the short-side portion) to each other. The first connecting arm 51C and the second connecting arm 51D are disposed in parallel to each other.

The falling restriction member 51 is configured to change a posture between a retraction posture and a protrusion posture. Here, as illustrated in an upper portion of FIG. 9, the retraction posture is a posture in which the falling restriction member 51 is retracted to a position that does not overlap with the container 7 held by the holding device 30 when viewed in the up-down direction. In the present embodiment, in the retraction posture, the long-side portion of the driven arm 51A, the long-side portion of the parallel arm 51B, the first connecting arm 51C, and the second connecting arm 51D are all in a state of being disposed along the width direction Y. As illustrated in the lower portion of FIG. 9, the protrusion posture is a posture in which the falling restriction member 51 protrudes to a position overlapping with the container 7 held by the holding device 30 when viewed in the up-down direction. In the present embodiment, in the protrusion posture, each of the long-side portions of the driven arm 51A and the parallel arm 51B is disposed along the front-rear direction X, and the first connecting arm 51C and the second connecting arm 51D are disposed along the width direction Y. A part of the first connecting arm 51C and a part of the parallel arm 51B overlap with the container 7 when viewed in the up-down direction.

As illustrated in FIG. 10, the in-and-out drive unit 53 is configured to include an in-and-out electric motor 53A and a drive shaft 53B connected to the in-and-out electric motor 53A. The in-and-out electric motor 53A rotationally drives the drive shaft 53B within a predetermined angle range to rotate the driven arm 51A connected to the drive shaft 53B within a predetermined angle range. With the rotation of the driven arm 51A, the parallel arm 51B also rotate, and the first connecting arm 51C connected to the distal end portion of the long-side portion of each of the driven arm 51A and the parallel arm 51B moves back and forth in the front-rear direction X. As a result, the in-and-out drive unit 53 changes the posture of the falling restriction member 51 between the protrusion posture and the retraction posture. The falling restriction member 51 receives the container 7 in the protrusion posture when the container 7 is likely to fall for some reason, and prevents the container 7 from falling.

The lateral swing suppression device 60 suppresses the lateral swing of the container 7 in a state in which the holding device 30 in the lifted position holds the container 7. As illustrated in FIGS. 9 and 10, the lateral swing suppression device 60 includes a support mechanism 61, an abutment roller 62, a support drive unit 63, and a brake 65.

The support mechanism 61 supports the abutment roller 62. The support mechanism 61 according to the present embodiment includes a rotation arm assembly 61A, a support bracket 61B, and an interlocking arm 61C. The rotation arm assembly 61A includes a proximal end-side arm 61Aa and a distal end-side arm 61Ab. The distal end-side arm 61Ab is disposed to be superimposed on the proximal end-side arm 61Aa vertically while being rotatably connected with respect to the proximal end-side arm 61Aa at an end portion on the proximal end-side. The rotation arm assembly 61A is rotatably connected to the drive shaft 53B constituting the in-and-out drive unit 53 at the proximal end portion of the proximal end-side arm 61Aa. In addition, the rotation arm assembly 61A is integrally connected to the support bracket 61B at the distal end portion of the distal end-side arm 61Ab. The abutment roller 62 is rotatably supported by the support bracket 61B.

In the present embodiment, a biasing member 61D is disposed between the proximal end-side arm 61Aa and the distal end-side arm 61Ab constituting the rotation arm assembly 61A. The biasing member 61D is provided such that a biasing force for causing the distal end-side arm 61Ab to rotate with respect to the proximal end-side arm 61Aa is applied. The biasing member 61D biases the distal end-side arm 61Ab to be close to the container 7 held by the holding device 30.

The interlocking arm 61C is rotatably connected to each of the second connecting arm 51D constituting the falling restriction member 51 and the rotation arm assembly 61A (specifically, the distal end-side arm 61Ab). The interlocking arm 61C has a role of rotating the rotation arm assembly 61A about the position of the drive shaft 53B as an axis in accordance with the movement of the second connecting arm 51D.

The abutment roller 62 is rotatably supported by the support mechanism 61 (specifically, the support bracket 61B). The abutment roller 62 is disposed to be able to abut against at least one of the outer side surface 71a of the bottom plate 71 or the outer side surface 72a of the side wall 72 of the container 7 held by the holding device 30 in the lifted position. In the present embodiment, the abutment roller 62 is disposed to be able to abut against the outer side surface 71a of the bottom plate 71 of the container 7 held by the holding device 30 in the lifted position. In the present embodiment, the outer side surface 71a of the bottom plate 71 corresponds to the "container outer side surface". As illustrated in FIG. 10, in a state in which the abutment roller 62 abuts against the outer side surface 71a of the container 7, a rotation axis center 62x of the abutment roller 62 is parallel to a center axis 7x of the container 7 (specifically, a center axis of the outer side surface 71a of the bottom plate 71). In a state in which the abutment roller 62 is separated from the outer side surface 71a of the container 7, the rotation axis center 62x of the abutment roller 62 may not be parallel to the center axis 7x of the container 7.

At least the outer peripheral surface 62a of the abutment roller 62 is made of an elastic member. In the present embodiment, the abutment roller 62 is configured such that a portion (doughnut-shaped portion) having a predetermined thickness on the radially outward side including the outer peripheral surface 62a is made of an elastic member. A specific material of the elastic member constituting the abutment roller 62 is not particularly limited, and for example, rubber materials such as urethane rubber, silicone rubber, nitrile rubber, ethylene propylene rubber, butyl rubber, and chloroprene rubber are able to be used.

The abutment roller 62 is configured to change a posture between a separation posture and an abutment posture. Here, as illustrated in the upper portion of FIG. 9, the separation posture is a posture in which the abutment roller 62 is separated from both the outer side surface 71a of the bottom plate 71 and the outer side surface 72a of the side wall 72 of the container 7 held by the holding device 30. In the separation posture, the abutment roller 62 is disposed closer to the cover body 45 side in the front-rear direction X. As illustrated in the lower portion of FIG. 9, the abutment posture is a posture in which the abutment roller 62 abuts against at least one of the outer side surface 71a of the bottom plate 71 and the outer side surface 72a of the side wall 72 (in the present example, the outer side surface 71a of the bottom plate 71) of the container 7 held by the holding device 30. In the abutment posture, the outer peripheral surface 62a of the abutment roller 62 abuts against the outer side surface 71a of the container 7 from the outside. The outer peripheral surface 62a of the abutment roller 62 is a cylindrical surface parallel to the rotation axis center 62x of the abutment roller 62.

In the present embodiment, the support drive unit 63 is configured by using the in-and-out drive unit 53, a part of the falling restriction member 51, and a part of the support mechanism 61. Specifically, the support drive unit 63 is configured by using the in-and-out electric motor 53A, the drive shaft 53B, the driven arm 51A, the second connecting arm 51D, and the interlocking arm 61C.

As described above, the in-and-out electric motor 53A rotationally drives the drive shaft 53B within a predetermined angle range to rotate the driven arm 51A connected to the drive shaft 53B within a predetermined angle range. With the rotation of the driven arm 51A, the second connecting arm 51D that is connected, in a freely variable angle, to the driven arm 51A and the interlocking arm 61C that is connected, in a freely variable angle, to the driven arm 51A are displaced, respectively. Then, with the displacement of the interlocking arm 61C, the rotation arm assembly 61A in which the end portion on the side opposite to the abutment roller 62 is rotatably connected to the drive shaft 53B swings with the position of the drive shaft 53B as an axis. As a result, the support drive unit 63 changes the posture of the abutment roller 62 between the abutment posture and the separation posture.

As described above, in the present embodiment, the in-and-out drive unit 53 and the support drive unit 63 share the driving force source (that is, the in-and-out electric motor 53A) and a part of the link mechanism (that is, the driven arm 51A and the second connecting arm 51D). Therefore, the abutment roller 62 changes the posture between the separation posture and the abutment posture by being interlocked to the posture change between the retraction posture and the protrusion posture of the falling restriction member 51. Specifically, the abutment roller 62 takes the separation posture when the falling restriction member 51 is in the retraction posture and takes the abutment posture when the falling restriction member 51 is in the protrusion posture.

As described above, the support mechanism 61 includes the biasing member 61D, and the rotation arm assembly 61A (distal end-side arm 61Ab) is biased by the operation of the biasing member 61D to be close to the side of the container 7 held by the holding device 30. Therefore, the abutment roller 62 that is rotatably supported by the support bracket 61B integrally connected to the rotation arm assembly 61A is biased to be pushed toward the outer side surface 71a of the container 7 in the abutment posture. The abutment roller 62 stably abuts against the outer side surface 71a of the container 7 suspended and held in the abutment posture to suppress the lateral swing of the container 7.

In the present embodiment, the abutment roller 62 has a concave groove 62G that is recessed inward with respect to the outer peripheral surface 62a, as illustrated in FIG. 10, instead of having the outer peripheral surface 62a formed of an entirely smooth cylindrical surface with no irregularities. The concave groove 62G is formed in a region of the outer peripheral surface 62a of the abutment roller 62 in the abutment posture, corresponding to the convex portion 71P of the container 7 held by the holding device 30. The concave groove 62G is formed to include a region occupied by the convex portion 71P in the outer peripheral surface 62a of the abutment roller 62 in the abutment posture in the up-down direction Z. In addition, the concave groove 62G is formed to extend continuously over the entire periphery. In the present embodiment, the concave groove 62G is recessed in a V-shape from the outer peripheral surface 62a and has a triangular cross-sectional shape.

The brake 65 selectively restricts the rotation of the abutment roller 62. As the brake 65, for example, an electromagnetic brake is able to be used. The electromagnetic brake constituting the brake 65 may be an excitation operation type or a non-excitation operation type. The brake 65 is switched between on and off, for example, according to the traveling state of the transport vehicle 1. In the present embodiment, the transport vehicle 1 is configured such that the brake 65 is unoperated and the abutment roller 62 is rotatable during traveling, for example, in a straight section, and the brake 65 is operated to stop the rotation of the abutment roller 62 during traveling in a curved section, according to the position in the movement path in which the transport vehicle 1 travels.

Other Embodiments (1) In the above-described embodiment, the configuration is described as an example in which the abutment roller 62 is biased to be pressed toward the outer side surface 71a of the container 7 in the abutment posture. However, the configuration is not limited to this, and the abutment roller 62 may not be biased to be pressed toward the outer side surface 71a of the container 7 in the abutment posture. In such a case, the biasing member 61D may not be provided, and the rotation arm assembly 61A may be integrated without being divided into the proximal end-side arm 61Aa and the distal end-side arm 61Ab.

(2) In the above-described embodiment, the configuration is described as an example in which the abutment roller 62 is made of the clastic member. However, the configuration is not limited to this, and the abutment roller 62 may be made of a hard member.

(3) In the above-described embodiment, the configuration is described as an example in which the concave groove 62G formed in the abutment roller 62 has the triangular cross-sectional shape. However, the configuration is not limited to this, and the concave groove 62G may be formed to have various cross-sectional shapes, such as a rectangular shape, a trapezoidal shape, a semicircular shape, a long circle shape, and an elliptical shape.

(4) In the above-described embodiment, the configuration is described as an example in which the rotation axis center 62x of the abutment roller 62 and the center axis 7x of the container 7 are parallel to each other in a state in which the abutment roller 62 abuts against the outer side surface 71a of the container 7. However, the configuration is not limited to this, and the rotation axis center 62x of the abutment roller 62 and the center axis 7x of the container 7 may be non-parallel in a state in which the abutment roller 62 abuts against the outer side surface 71a of the container 7. For example, the rotation axis center 62x of the abutment roller 62 may be disposed to be inclined with respect to the center axis 7x of the container 7 at an angle of 10° or less. As described above, the rotation axis center 62x of the abutment roller 62 may be disposed along the center axis 7x of the container 7.

(5) In the above-described embodiment, the configuration is described as an example in which the abutment roller 62 abuts against only the outer side surface 71a of the bottom plate 71 of the container 7 held by the holding device 30 in the lifted position. However, the configuration is not limited to this, and the abutment roller 62 may be provided to abut against both the outer side surface 71a of the bottom plate 71 and the outer side surface 72a of the side wall 72 of the container 7. Alternatively, the abutment roller 62 may be provided to abut against only the outer side surface 72a of the side wall 72 of the container 7.

(6) In the above-described embodiment, the configuration is described as an example in which the electromagnetic brake is used as the brake 65 provided in the lateral swing suppression device 60. However, the configuration is not limited to this, and another driving system such as a mechanical brake or an oil pressure brake may be used as the brake 65. Alternatively, the brake 65 may not be provided in the lateral swing suppression device 60.

(7) In the above-described embodiment, the configuration is described as an example in which the abutment roller 62 changes the posture between the separation posture and the abutment posture by being interlocked to the posture change between the retraction posture and the protrusion posture of the falling restriction member 51. However, the configuration is not limited to this, and the abutment roller 62 and the falling restriction member 51 may be separately driven to independently change the posture.

(8) In the above-described embodiment, the configuration is described as an example in which the pair of shielding members 36 change the posture between the closed posture and the opened posture by being interlocked to the posture change between the holding posture and the holding release posture of the pair of support portions 32. However, the configuration is not limited to this, and the pair of the shielding members 36 and the pair of the support portions 32 may be separately driven to independently change the posture.

(9) In the above-described embodiment, the configuration is described as an example in which the holding device 30 includes the shielding member 36 that partially covers the front opening 75a of the container 7. However, the configuration is not limited to this, and the holding device 30 may not include the shielding member 36.

(10) In the above-described embodiment, the configuration is described as an example in which the pair of support portions 32 are provided side by side in the front-rear direction X. However, the configuration is not limited to this, and the pair of support portions 32 may be provided side by side in the width direction Y. Alternatively, the pair of support portions 32 may be provided side by side in a direction intersecting both the front-rear direction X and the width direction Y.

(11) In the above-described embodiment, the configuration is described as an example in which the holding drive unit 33 includes the holding electric motor and the mechanism that converts the rotation of the holding electric motor into the propulsion force in the front-rear direction X. However, the configuration is not limited to this, and the holding drive unit 33 may be configured to include, for example, a mechanism that directly generates the propulsion force in the front-rear direction X, such as a fluid pressure cylinder mechanism.

(12) In the above-described embodiment, the configuration is described as an example in which the holding device 30 supports the concave portion 73E formed on the inclined top plate 73 of the container 7 with the pair of support portions 32. However, the configuration is not limited to this, and for example, the inclined top plate 73 of the container 7 may be formed to protrude outward in a flange shape from the side wall 72, and the holding device 30 may support the flange-shaped protruding portion of the inclined top plate 73 with the pair of support portions 32. In addition, a handle-like protruding portion may be provided on the side wall 72 of the container 7 at a position different from the inclined top plate 73 in the up-down direction, and the holding device 30 may support the handle-like protruding portion with the pair of support portions 32. The handle-like protruding portion may be integrally formed with the side wall 72, or may be formed of a separate member from the side wall 72 and fixed to the side wall 72.

(13) In the above-described embodiment, the configuration is described as an example in which a portion (portion on the lowest end side in the container 7) on the lower side with respect to the peripheral groove 71G in the bottom plate 71 of the container 7 is the convex portion 71P. However, the configuration is not limited to this, and for example, the convex portion 71P may be provided at an intermediate portion of the container 7 in the up-down direction. In this case, for example, two peripheral grooves 71G may be provided at different positions in the bottom plate 71 of the container 7 in the up-down direction, and a portion between the two peripheral grooves 71G may be the convex portion 71P.

(14) In the above-described embodiment, the configuration is described as an example in which the outer side surface of the convex portion 71P of the container 7 is located on the same cylindrical surface as the outer side surface 71a of the bottom plate 71. However, the configuration is not limited to this, and the convex portion 71P of the container 7 may be formed, for example, in a flange shape to protrude outward with respect to the outer side surface 71a of the bottom plate 71.

(15) In the above-described embodiment, the configuration is described as an example in which the convex portion 71P of the container 7 is continuously formed over the entire periphery. However, the configuration is not limited to this, and the convex portion 71P may be formed in an intermittent manner in the circumferential direction. In this case, for example, a configuration may be adopted in which a plurality of the protruding portions is arranged along the circumferential direction.

(16) In the above-described embodiment, the configuration is described as an example in which an open cassette that does not include a lid for closing the opening 75 is used as the container 7. However, the configuration is not limited to this, and the container 7 (for example, a FOUP, a reticle pod, or the like) provided with a lid for closing the opening 75 may be used.

(17) The configurations disclosed in each of the above-described embodiments (including the above-described embodiments and other embodiments; the same applies hereinafter) are also able to be applied in combination with the configurations disclosed in other embodiments as long as there is no contradiction. Even for other configurations, the embodiments disclosed in the present specification are merely examples in all respects, and are able to be appropriately modified within a range not departing from the gist of the present disclosure.

Summary of Embodiments

In summary, the transport vehicle according to the present disclosure suitably includes the following configurations.

A transport vehicle that transports a container while being suspended, the transport vehicle including a lateral swing suppression device configured to abut against an outer side surface of the container that is suspended and held, and suppress a lateral swing of the container, in which the lateral swing suppression device includes an abutment roller configured to rotatably abut against the outer side surface of the container, and a concave groove extending continuously over an entire periphery of an outer peripheral surface of the abutment roller is formed in a region corresponding to a convex portion that is a portion distinguished from the outer side surface of the container and protrudes outward compared to other portions adjacent to at least one of an upper side or a lower side of the container.

According to this configuration, by rotatably providing the abutment roller that abuts against the outer side surface of the container, the lateral swing of the container suspended and held during the transportation is able to be suppressed. In this case, in a case in which the outer side surface of the container has the convex portion, there is a concern that the outer peripheral surface of the abutment roller may be locally worn by coming into contact with the convex portion, but since the concave groove that extends continuously over the entire periphery is formed in the region corresponding to the convex portion, the abutment roller does not come into contact with the convex portion of the container. Therefore, the amount of generated dust or the like due to wear of the abutment roller is able to be suppressed. From these, the lateral swing of the container suspended and held is able to be suppressed, the wear of the abutment roller due to the contact with the container is able to be suppressed to a minimum, and the amount of generated dust or the like is able to be suppressed to a minimum.

As one aspect, it is preferable that in a state in which the abutment roller abuts against the outer side surface of the container, a rotation axis center of the abutment roller is parallel to a center axis of the outer side surface of the container.

According to this configuration, the abutment roller is able to be smoothly rotated while abutting against the outer side surface of the container, and thus the wear of the abutment roller is able to be suppressed to a minimum from this point. In addition, since the concave groove of the abutment roller and the convex portion of the container are in a positional relationship facing each other from the front, the wear of the abutment roller is able to be appropriately suppressed to a minimum by simply providing the concave groove of the minimum necessary size, which is only slightly larger than the convex portion.

As one aspect, it is preferable that the lateral swing suppression device includes a support mechanism configured to support the abutment roller, and a support drive unit configured to change a posture of the abutment roller between an abutment posture in which the abutment roller abuts against the outer side surface of the container and a separation posture in which the abutment roller is separated from the outer side surface of the container, and the support mechanism is configured to bias the abutment roller toward a side on which the abutment roller is pressed against the outer side surface of the container in the abutment posture.

According to this configuration, the operation of starting the holding of the container or releasing the holding of the container is able to be easily performed in a state in which the abutment roller is in the separation posture. In addition, since the abutment roller in the abutment posture is biased to be pressed against the outer side surface of the container, the lateral swing of the container is able to be effectively suppressed.

As one aspect, it is preferable that the transport vehicle includes a falling restriction member configured to be disposed on a lower side with respect to a bottom surface of the container and restrict falling of the container; and an in-and-out drive unit configured to change a posture of the falling restriction member between a protrusion posture in which the falling restriction member protrudes to a position that overlaps with the container and a retraction posture in which the falling restriction member retracts to a position that does not overlap with the container when viewed in an up-down direction, in which the falling restriction member is configured to be in the protrusion posture as the abutment roller is in the abutment posture and to be in the retraction posture as the abutment roller is in the separation posture, by being interlocked to the posture change of the abutment roller.

According to this configuration, even in a case in which the suspending and holding of the container is erroneously released for some reason, the falling restriction member is able to receive the container and prevent the container from falling. In addition, by interlocking the posture change of the falling restriction member between the protrusion posture and the retraction posture to the posture change of the abutment roller between the abutment posture and the separation posture, the falling of the container in a rare case is able to be prevented while suppressing the lateral swing of the container with a relatively simple configuration.

As one aspect, it is preferable that the outer peripheral surface of the abutment roller is made of an elastic member.

According to this configuration, since the outer peripheral surface of the abutment roller elastically comes into contact with the outer side surface of the container, the lateral swing of the container is able to be effectively suppressed. Although a situation is generated in which wear due to friction is likely to occur as compared with a case in which the outer peripheral surface of the abutment roller is made of a material having high rigidity, the outer side surface of the abutment roller does not come into contact with the convex portion of the container due to the presence of the concave groove, so that there is no particular problem.

As one aspect, it is preferable that the lateral swing suppression device includes a brake configured to selectively restrict rotation of the abutment roller According to this configuration, the shaking manner of the container is able to be appropriately controlled by controlling the on/off of the brake in accordance with the traveling state of the transport vehicle or the like.

The transport vehicle according to the present disclosure may exhibit at least one of the above-described effects.

What is claimed is:

1. A transport vehicle that transports a container while being suspended, the transport vehicle, comprising:
a lateral swing suppression device configured to abut against an outer side surface of the container that is suspended and held, and suppress a lateral swing of the container,
wherein the lateral swing suppression device comprises an abutment roller configured to rotatably abut against the outer side surface of the container, and
wherein a concave groove extending continuously over an entire periphery of an outer peripheral surface of the abutment roller is formed in a region corresponding to a convex portion that is a portion distinguished from the outer side surface of the container and protrudes outward compared to other portions adjacent to at least one of an upper side or a lower side of the container.

2. The transport vehicle according to claim 1,
wherein in a state in which the abutment roller abuts against the outer side surface of the container, a rotation axis center of the abutment roller is parallel to a center axis of the outer side surface of the container.

3. The transport vehicle according to claim 1,
wherein the lateral swing suppression device comprises:
a support mechanism configured to support the abutment roller, and
a support drive unit configured to change a posture of the abutment roller between an abutment posture in which the abutment roller abuts against the outer side surface of the container and a separation posture in which the abutment roller is separated from the outer side surface of the container, and
wherein the support mechanism is configured to bias the abutment roller toward a side on which the abutment roller is pressed against the outer side surface of the container in the abutment posture.

4. The transport vehicle according to claim 3, further comprising:
a falling restriction member configured to be disposed on a lower side with respect to a bottom surface of the container and restrict falling of the container; and
an in-and-out drive unit configured to change a posture of the falling restriction member between a protrusion posture in which the falling restriction member protrudes to a position that overlaps with the container and a retraction posture in which the falling restriction member retracts to a position that does not overlap with the container when viewed in an up-down direction, and
wherein the falling restriction member is configured to be in the protrusion posture as the abutment roller is in the abutment posture and to be in the retraction posture as the abutment roller is in the separation posture, by being interlocked to the posture change of the abutment roller.

5. The transport vehicle according to claim 1,
wherein the outer peripheral surface of the abutment roller is made of an elastic member.

6. The transport vehicle according to claim 1,
wherein the lateral swing suppression device comprises a brake configured to selectively restrict rotation of the abutment roller.

* * * * *